(12) United States Patent
Yamaguchi et al.

(10) Patent No.: US 6,489,666 B1
(45) Date of Patent: Dec. 3, 2002

(54) SEMICONDUCTOR DEVICE WITH IMPROVED HEAT SUPPRESSION IN PERIPHERAL REGIONS

(75) Inventors: Yoshihiro Yamaguchi, Fukuoka (JP); Katsumi Satoh, Tokyo (JP); Noritoshi Hirano, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/624,998

(22) Filed: Jul. 25, 2000

(30) Foreign Application Priority Data

Feb. 23, 2000 (JP) ........................................ 2000-045998

(51) Int. Cl.⁷ .................... H01L 29/06; H01L 23/58; H01L 23/93
(52) U.S. Cl. .................. 257/653; 257/490; 257/495; 257/496; 257/599; 257/600
(58) Field of Search ................ 257/104, 106, 257/461, 490, 494, 495, 496, 599, 600, 603, 605, 653

(56) References Cited

U.S. PATENT DOCUMENTS 4,215,358 A  *  7/1980  Wataze et al.
4,450,469 A  *  5/1984  Yamamoto
4,529,994 A  *  7/1985  Sakai

FOREIGN PATENT DOCUMENTS

| JP | 60-187063 | 9/1985 |
| JP | 10-303436 | 11/1998 |
| JP | 11-40822 | 2/1999 |

* cited by examiner

Primary Examiner—Ngân V. Ngô
(74) Attorney, Agent, or Firm—Oblon, Spivak, McClelland, Maier & Neustadt, P.C.

(57) ABSTRACT

A semiconductor device (102) comprises an N type semiconductor substrate (1). A P layer (22) is formed in a first surface (S1) of the semiconductor substrate (1), and a P layer (23) is formed in the semiconductor substrate (1) and in contact with the first surface (S1) and a second surface (S2) of the semiconductor substrate (1) corresponding to a beveled surface. The P layer (23) surrounds the P layer (22) in non-contacting relationship with the P layer (22). A separation distance (D) between the P layers (22, 23) is set at not greater than 50 μm. A distance (D23) between a third surface (S3) of the semiconductor substrate (1) and a portion of the P layer (23) which is closer to the third surface (S3) is less than a distance (D22) between the third surface (S3) and a portion of the P layer (22) which is closer to the third surface (S3). An N⁺⁺ layer (24) is formed in part of the third surface (S3) which is substantially opposed to the P layer (22), and an N⁺ layer (25) is formed in contact with the N⁺⁺ layer (24) and the third surface (S3). A cathode electrode (33) is formed on the third surface (S3) so as to cover a region (S322) of the third surface (S3) which is opposed to the P layer (22). The semiconductor device (102) suppresses heat generation to perform a stable operation.

5 Claims, 6 Drawing Sheets

F I G . 1
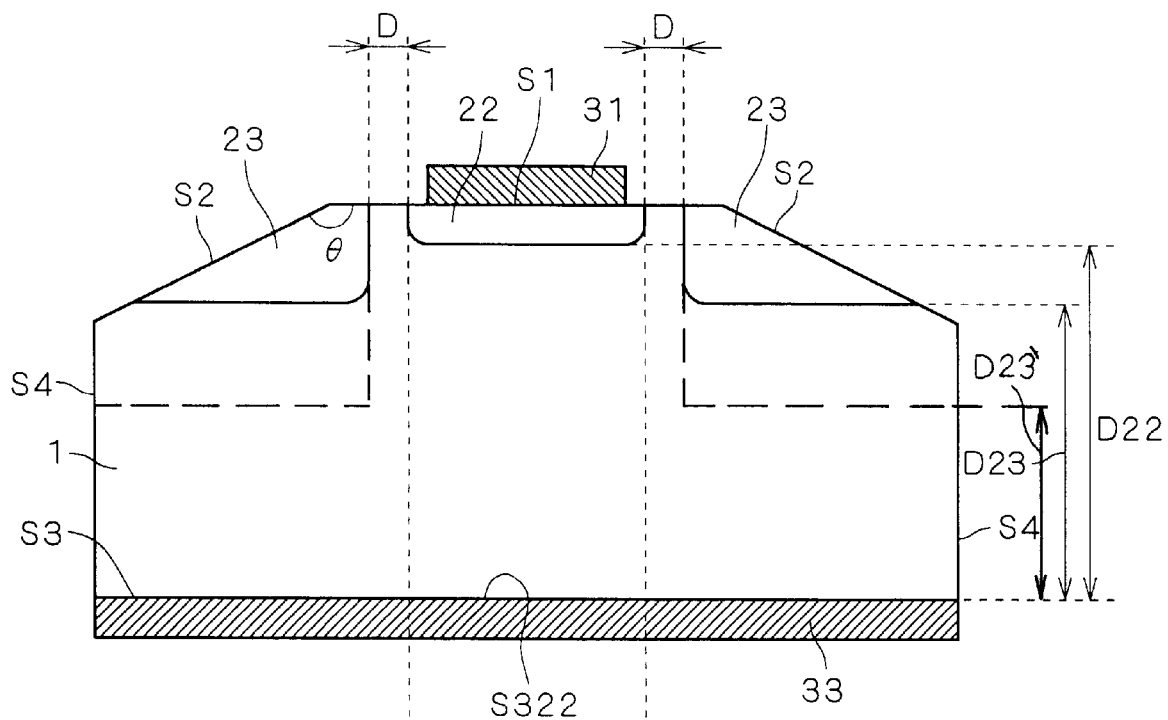

SEMICONDUCTOR DEVICE WITH IMPROVED HEAT SUPPRESSION IN PERIPHERAL REGIONS

BACKGROUND OF THE INVENTION

1. Field of the Invention

The present invention relates to a semiconductor device and, more particularly, to a technique for reducing heat generation of a semiconductor device to stabilize the operation thereof.

2. Description of the Background Art

FIG. 6 is a vertical cross-sectional view for illustrating a background art semiconductor device 101P. As shown in FIG. 6, the semiconductor device 101P comprises an N⁻ type semiconductor substrate 1P made of silicon or the like, and a P layer 2P is formed in a surface S1P of the semiconductor substrate 1P. The P layer 2P is formed in contact with a beveled surface S2P (referred to also as a "surface S2P" hereinafter) contiguous with the surface S1P. An anode electrode 31P is formed on the surface S1P. An N⁺ layer 25P is formed in a surface S3P opposed to the surfaces S1P and S2P. A cathode electrode 33P is formed on the surface S3P in opposed relation to the anode electrode 31P.

In general, carrier recombination centers are formed by proton irradiation or the like near a PN junction of the P layer 2P and the semiconductor substrate 1P, and control a carrier lifetime near the PN junction. The carrier lifetime in the entire semiconductor substrate 1P is controlled to be short by heavy metal diffusion, electron beam irradiation or the like.

FIG. 7 is a vertical cross-sectional view for illustrating current flows in the semiconductor device 101P. In FIG. 7, forward current is schematically shown by solid arrows and reverse current is schematically shown by dashed arrows.

FIG. 8 schematically illustrates a reverse recovery operation in the semiconductor device. In general, when switching of an external circuit causes the semiconductor device 101P to make an instantaneous transition from a forward current flowing state to a reverse-biased state, a large transient reverse current flows because of a minority carrier accumulation phenomenon. Such a reverse current has a current decrease rate determined by the value of the reverse bias and the inductance of the external circuit, and flows for a predetermined length of time.

More specifically, the reverse current flows until excess carriers remaining near the PN junction decrease in number to have a constant concentration or less and a depletion layer is established. When the established depletion layer starts bearing a reverse voltage, the reverse voltage gradually increases in accordance with the expansion of the depletion layer whereas the reverse current gradually decreases. Then, the device voltage becomes steadily equal to the applied reverse voltage, and the reverse recovery operation is completed.

In the background art semiconductor device 101P, the lifetime near the PN junction is controlled to be short as described above, thereby to decrease a forward voltage and the reverse current and to improve a maximum allowable on-state current rise rate (di/dt).

However, the background art semiconductor device 101P is disadvantageous in that the higher, for example, a driving frequency and the reverse bias voltage are, the greater a power loss, i.e. heat generation (self heat generation), is. Thus, the operation of the semiconductor device 101P might encounter a trouble due to the heat generation. At this time, the semiconductor substrate 1P generates a greater amount of heat in a peripheral portion 1AP thereof than near a central portion thereof, particularly a portion between the anode electrode 31P and the cathode electrode 33P. A cause of such a difference in the amount of heat generation is a poorer heat dissipating ability or heat emitting property of the peripheral portion 1AP of the semiconductor substrate 1P than that of the central portion thereof because of the absence of a metal layer such as the anode electrode 31P and the like on the surface of the peripheral portion 1AP of the semiconductor substrate 1P.

SUMMARY OF THE INVENTION

According to a first aspect of the present invention, a semiconductor device comprises: a first semiconductor layer of a first conductivity type having a first surface, a second surface surrounding the first surface and coupled to the first surface at an angle other than a right angle, and a third surface opposed to the first and second surfaces; a second semiconductor layer of a second conductivity type formed in the first surface; and a third semiconductor layer of the second conductivity type surrounding the second semiconductor layer in non-contacting relationship with the second semiconductor layer, the third semiconductor layer being formed in the first semiconductor layer and in contact with the second surface.

Preferably, according to a second aspect of the present invention, in the semiconductor device of the first aspect, a distance between the second semiconductor layer and the third semiconductor layer in their closely spaced positions is not greater than 50 μm.

Preferably, according to a third aspect of the present invention, in the semiconductor device of the first or second aspect, the third semiconductor layer extends closer to the third surface than does the second semiconductor layer.

Preferably, according to a fourth aspect of the present invention, the semiconductor device of any one of the first to third aspects further comprises a metal layer formed on the side of the third surface to cover a region of the third surface which is opposed to the second semiconductor layer.

Preferably, according to a fifth aspect of the present invention, the semiconductor device of any one of the first to fourth aspects further comprises a fourth semiconductor layer of the first conductivity type formed in part of the third surface which is substantially opposed to the second semiconductor layer, wherein the fourth semiconductor layer has an impurity concentration higher than the impurity concentration of its surrounding layer.

Preferably, according to a sixth aspect of the present invention, the semiconductor device of any one of the first to fifth aspects further comprises a fifth semiconductor layer of the first conductivity type formed in contact with the third surface, the fifth semiconductor layer having an impurity concentration higher than the impurity concentration of the first semiconductor layer.

In accordance with the first aspect of the present invention, the third semiconductor layer surrounds the second semiconductor layer in non-contacting relationship with the second semiconductor layer, and is formed in the first semiconductor layer and in contact with the second surface. This allows current to converge on the second semiconductor layer and, therefore, on the center of the first semiconductor layer, thereby suppressing heat generation in a peripheral portion of the first semiconductor layer. Therefore, the semiconductor device having the second surface corresponding to a so-called beveled surface can suppress a trouble resulting from the heat generation to perform a stable operation. Additionally, the second surface ensures a breakdown voltage or maximum allowable voltage.

In accordance with the second aspect of the present invention, the distance between the second semiconductor layer and the third semiconductor layer in their closely spaced positions is not greater than 50 μm. This ensures the suppression of a leakage current flowing when a reverse voltage is applied between the second semiconductor layer and the third surface.

In accordance with the third aspect of the present invention, the third semiconductor layer extends closer to the third surface than does the second semiconductor layer. This effectively alleviates a surface electric field strength at the second surface. Therefore, the increase in breakdown voltage of the semiconductor device is accomplished.

In accordance with the fourth aspect of the present invention, the metal layer is formed on the side of the third surface to cover the region of the third surface which is opposed to the second semiconductor layer. In other words, the metal layer covers, from the third surface side, a region in which converging current flows. Therefore, the metal (layer) having a great heat dissipating ability efficiently dissipates generated heat. The metal layer may cover a wider area including the above-mentioned region, thereby to further improve the ability to dissipate heat from the third surface.

In accordance with the fifth aspect of the present invention, the fourth semiconductor layer has the impurity concentration higher than the impurity concentration of its surrounding layer. Thus, the semiconductor device of the fifth aspect can decrease the reverse current during the reverse recovery operation, as compared with a semiconductor device which does not comprise the fourth semiconductor layer. Additionally, the fourth semiconductor layer formed in part of the third surface which is substantially opposed to the second semiconductor layer allows the reverse current to converge on the fourth semiconductor layer. This suppresses the heat generation in the peripheral portion of the first semiconductor layer during the reverse recovery operation. Therefore, the semiconductor device is provided which suppresses a trouble resulting from the heat generation to perform a stable operation.

In accordance with the sixth aspect of the present invention, the fifth semiconductor layer has the impurity concentration higher than the impurity concentration of the first semiconductor layer. Thus, the semiconductor device of the sixth aspect can decrease the reverse current, as compared with a semiconductor device which does not comprise the fifth semiconductor layer. This suppresses the heat generated by the reverse current. Therefore, the semiconductor device is provided which suppresses a trouble resulting from the heat generation to perform a stable operation.

Moreover, the fifth semiconductor layer formed in contact with the third surface can decrease an on-state voltage when an electrode is provided in contact with the third surface.

It is therefore a primary object of the present invention to provide a semiconductor device capable of suppressing heat generation to perform a stable operation.

It is another object of the present invention to provide a semiconductor device capable of ensuring the suppression of a leakage current flowing upon application of a reverse voltage, as well as accomplishing the primary object.

It is still another object of the present invention to provide a semiconductor device having a high breakdown voltage (or high maximum allowable voltage), as well as accomplishing the above-mentioned object(s).

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a vertical cross-sectional view for illustrating a semiconductor device according to a first preferred embodiment of the present invention;

DESCRIPTION OF THE PREFERRED EMBODIMENTS

<First Preferred Embodiment>

Figure 2:
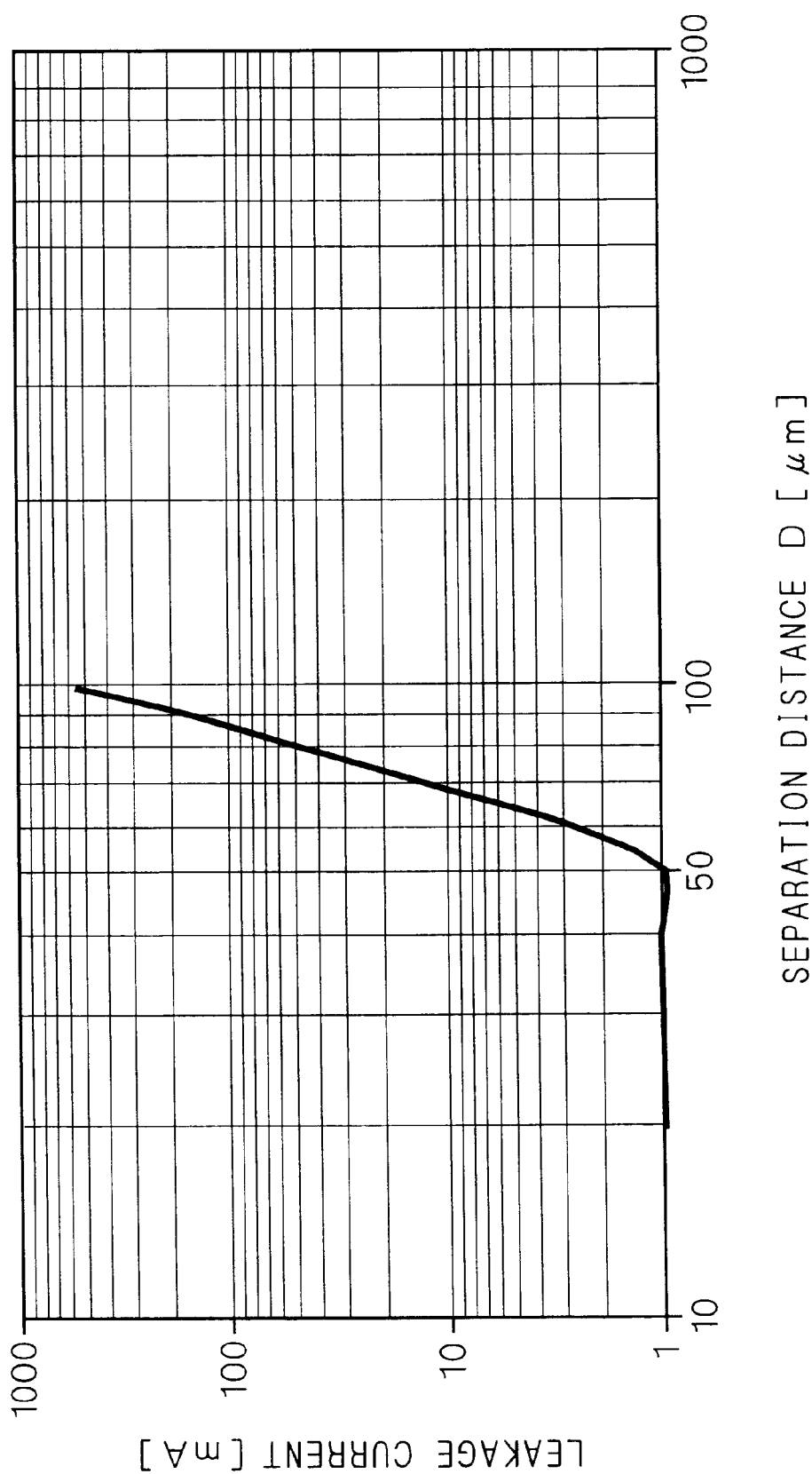
FIG. 2 is a graph for illustrating a relationship between a separation distance and a leakage current in the semiconductor device according to the first preferred embodiment.

FIG. 1 is a vertical cross-sectional view for illustrating a semiconductor device 101 according to a first preferred embodiment of the present invention. Examples of the semiconductor device 101 include a free-wheeling diode, a voltage clamping diode and the like for use in a high-breakdown-voltage switching device such as an IGBT (Insulated Gate Bipolar Transistor) and a GCT (Gate Commutated Turn-off Thyristor).

As illustrated in FIG. 1, the semiconductor device 101 comprises an N type (first conductivity type) semiconductor substrate (first semiconductor layer) 1 of a relatively low impurity concentration. The semiconductor substrate 1 is made of, for example, silicon. The semiconductor substrate 1 has surfaces S1 to S4. More specifically, the surface (second surface) S2 surrounds the surface (first surface) S1, and is coupled to the surface S1 at an angle θ other than 90 degrees. The surface S2 corresponds to a so-called beveled surface. The angle θ of the semiconductor device 101 is assumed to be an obtuse angle. The surface (third surface) S3 are opposed to the surfaces S1 and S2, and the surface or side surface S4 is coupled to the surfaces S2 and S3. The surfaces S1 to S4 form the outer surface of the semiconductor substrate 1.

A P type (second conductivity type) semiconductor layer (second semiconductor layer) 22 is formed in the surface S1 of the semiconductor substrate 1. A P type semiconductor layer (third semiconductor layer) 23 is formed in contact with the surfaces S2 and S1 in the semiconductor substrate 1. The semiconductor layers 22 and 23 are formed, for example, by ion implantation. The semiconductor layers 22 and 23 are also referred to hereinafter as a P layer 22 and a P layer 23, respectively. The P layer 23 surrounds the P layer 22 in a non-contacting relationship therewith, but does not traverse an inner portion of the semiconductor substrate 1 which lies between the P layer 22 and the surface S3. The P layer 23, which is illustrated herein as contacting both the surfaces S1 and S2, may be in contact with only the surface S2 or in contact with surface S2 and the side surface S4 (and the surface S1) as shown by the dashed line and according to the distances D and D23 and as illustrated in FIG. 1 by the distance D23'.

The semiconductor device 101 described herein has the P layer 22 of circular configuration and the P layer 23 of ring-shaped configuration concentric with the P layer 22 in top plan view as viewed from above the surface S1 of the semiconductor device 101. However, the P layer 22 may have an elliptical or tetragonal configuration whereas the P layer 23 has a corresponding configuration to the P layer 22.

The P layers 22 and 23 have respective impurity concentrations higher than that of the semiconductor substrate 1. The P layers 22 and 23 may be equal to or differ from each other in impurity concentration.

FIG. 2 shows a relationship between a distance or separation distance D between the P layers 22 and 23 in their closely spaced positions and a leakage current flowing when a reverse voltage is applied between the P layer 22 and a cathode electrode (metal layer) 33 to be described later. The separation distance D, more specifically, corresponds to a distance between the outer periphery of the P layer 22 and the inner periphery of the P layer 23 as viewed in the above-mentioned top plan view. It will be understood from the graph of FIG. 2 that the leakage current is very small when the separation distance D is not greater than 50 $\mu$m, and abruptly increases when the separation distance D exceeds 50 $\mu$m. With this in view, the separation distance D is set at not greater than 50 $\mu$m in the semiconductor device 101.

Additionally, the P layer 23 extends closer to the surface S3 than does the P layer 22. In other words, a distance D23 between the surface S3 and a portion of the P layer 23 which is closer to the surface S3 is less than a distance D22 between the surface S3 and a portion of the P layer 22 which is closer to the surface S3.

An anode electrode 31 is formed on the surface S1 and in contact with the P layer 22, and the cathode electrode (metal layer) 33 is formed on the entire surface S3. Specifically, the cathode electrode 33 is formed on the side of the surface S3 so as to cover a region S322 of the surface S3 which is opposed to the P layer 22. The anode electrode 31 and the cathode electrode 33 are formed of a metal having a low electric resistance, e.g. molybdenum (Mo), by a vapor deposition process or the like.

The semiconductor device 101 produces effects to be described below.

As above discussed, the P layers 22 and 23 are in non-contacting relationship with each other. This allows the forward current and reverse current flowing in the semiconductor device 101 to converge or concentrate on a portion lying between the P layer 22 and the cathode electrode 33, that is, on the center of the semiconductor substrate 1. Hence, the semiconductor device 101 can suppress heat generation in a peripheral portion thereof, as compared with the background art semiconductor device 101P (See FIG. 6). Therefore, the semiconductor device 101 having the so-called beveled surface S2 suppresses a trouble resulting from heat generation to perform a stable operation.

Furthermore, the beveled surface S2 ensures a breakdown voltage or maximum allowable voltage.

Figure 6:
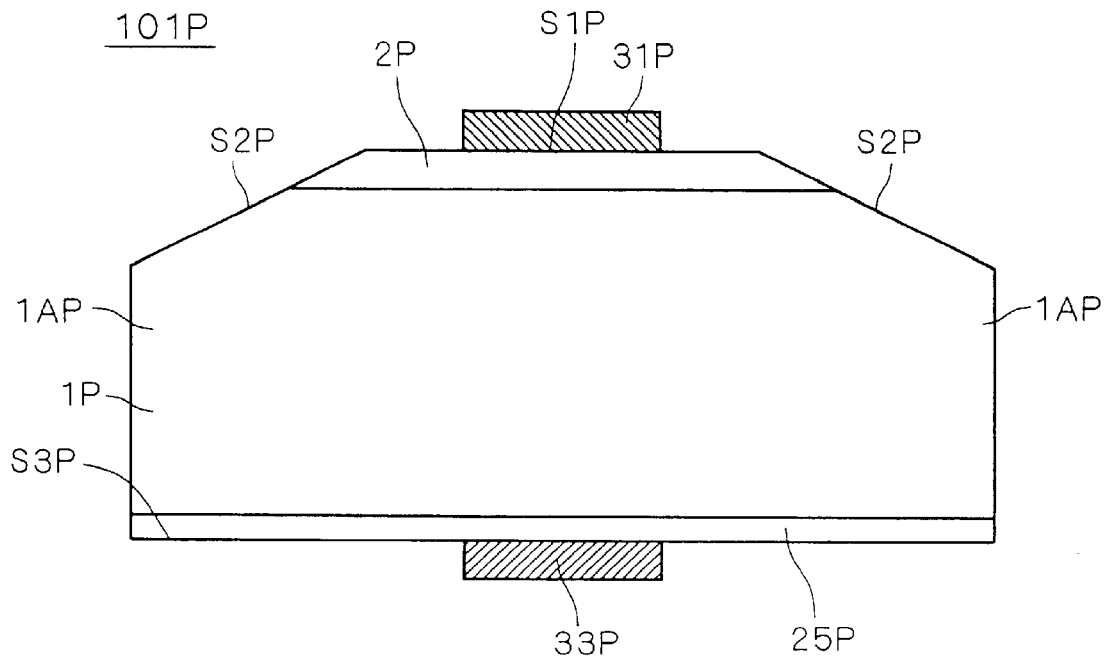
FIG. 6 is a vertical cross-sectional view for illustrating a background art semiconductor device.
Figure 7:
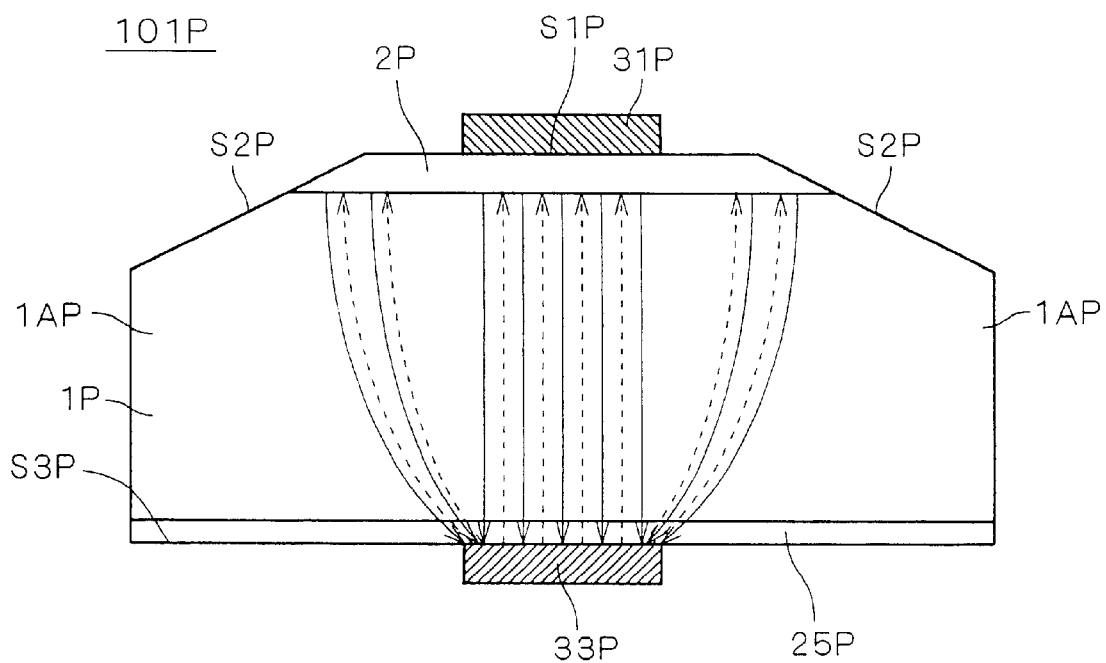
FIG. 7 is a vertical cross-sectional view for illustrating current flows in the background art semiconductor device.
Figure 8:
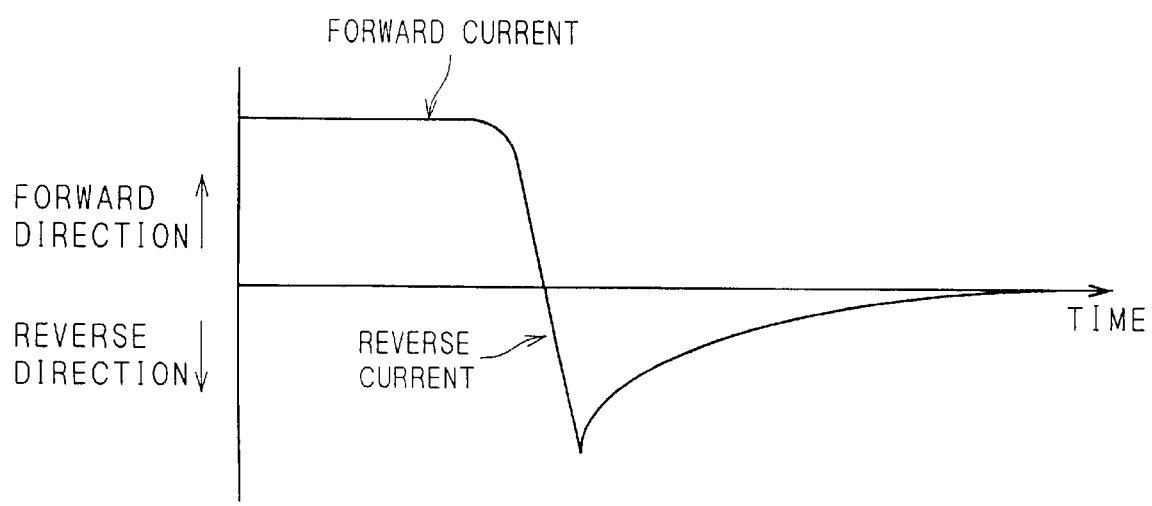
FIG. 8 schematically illustrates a reverse recovery operation in the semiconductor device.

A comparison between FIGS. 1 and 6 shows that the P layers 22 and 23 may be regarded as two layers into which the P layer 2P of the background art semiconductor device 101P is separated at the outside of the anode electrode 31P. If the anode electrodes 31 and 31P are equal in size, the semiconductor device 101 has the same current capacity as the background art semiconductor device 101P. Specifically, the separation of the P layer 2P into the two P layers 22 and 23 does not cause the semiconductor device 101 to have the current capacity lower than that of the background art semiconductor device 101P. The semiconductor device 101 can utilize the manufacturing and product quality evaluating processes applied to the background art semiconductor device 101P.

Further, the cathode electrode 33 is formed on the surface S3, specifically on the side of the surface S3, so as to cover the region S322 of the surface S3 which is opposed to the P layer 22. In other words, the cathode electrode 33 covers, from the surface S3 side, a region in which the above-mentioned converging currents flow. Since metal generally has a great heat dissipating ability or heat emitting property, the cathode electrode 33 can efficiently dissipate heat. The cathode electrode 33 of the semiconductor device 101 which is formed on the entire surface S3 has a greater ability to dissipate heat from the surface S3 than a cathode electrode formed only near the region S322.

Moreover, the separation distance D of not greater than 50 $\mu$m between the P layers 22 and 23 ensures the suppression of the leakage current flowing when the reverse voltage is applied between the P layer 22 and the cathode electrode 33 (See FIG. 2).

Additionally, the P layer 23 extending closer to the surface S3 than the P layer 22 effectively alleviates a surface electric field strength at the surface S2. Therefore, the semiconductor device 101 has a breakdown voltage improved over a semiconductor device in which the distance D23 is not less than the distance D22.

<Second Preferred Embodiment>

Figure 3:
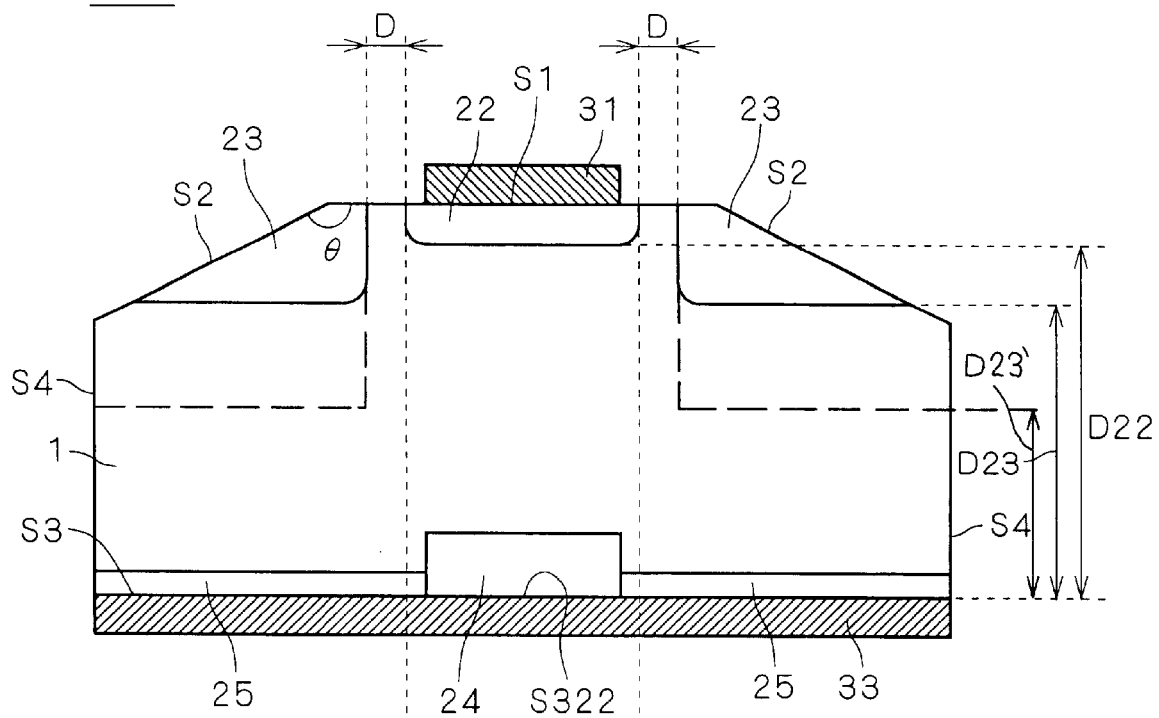
FIG. 3 is a vertical cross-sectional view for illustrating the semiconductor device according to a second preferred embodiment of the present invention.

FIG. 3 is a vertical cross-sectional view for illustrating a semiconductor device 102 according to a second preferred embodiment of the present invention. As illustrated in FIG. 3, the semiconductor device 102 comprises a semiconductor layer (fourth semiconductor layer) 24 and a semiconductor layer (fifth semiconductor layer) 25 in addition to the components of the semiconductor device 101 of FIG. 1.

More specifically, the N type semiconductor layer (fourth semiconductor layer) 24 is formed in part of the surface S3 which is substantially opposed to the P layer 22 (See the region S322), and the N type semiconductor layer (fifth semiconductor layer) 25 is formed in contact with the semiconductor layer 24 and the surface S3. The semiconductor layer 25 has an impurity concentration higher than that of the semiconductor substrate 1, and the semiconductor layer 24 has an impurity concentration higher than those of its surrounding layers, i.e. the semiconductor substrate 1 and the semiconductor layer 25. The semiconductor layers 24 and 25 are also referred to hereinafter as an $N^{++}$ layer 24 and an $N^+$ layer 25, respectively.

The $N^{++}$ layer 24 and the $N^+$ layer 25 are formed by ion implantation, although the $N^+$ layer 25 may be formed by deposition on the surface S3 in which case the $N^+$ layer 25 is also formed in contact with the $N^{++}$ layer 24 and the surface S3. The cathode electrode 33 is formed on the $N^+$ layer 25, in which case the cathode electrode 33 is also formed on the side of the surface S3 so as to cover the region S322 of the surface S3 which is opposed to the P layer 22.

Figure 4:
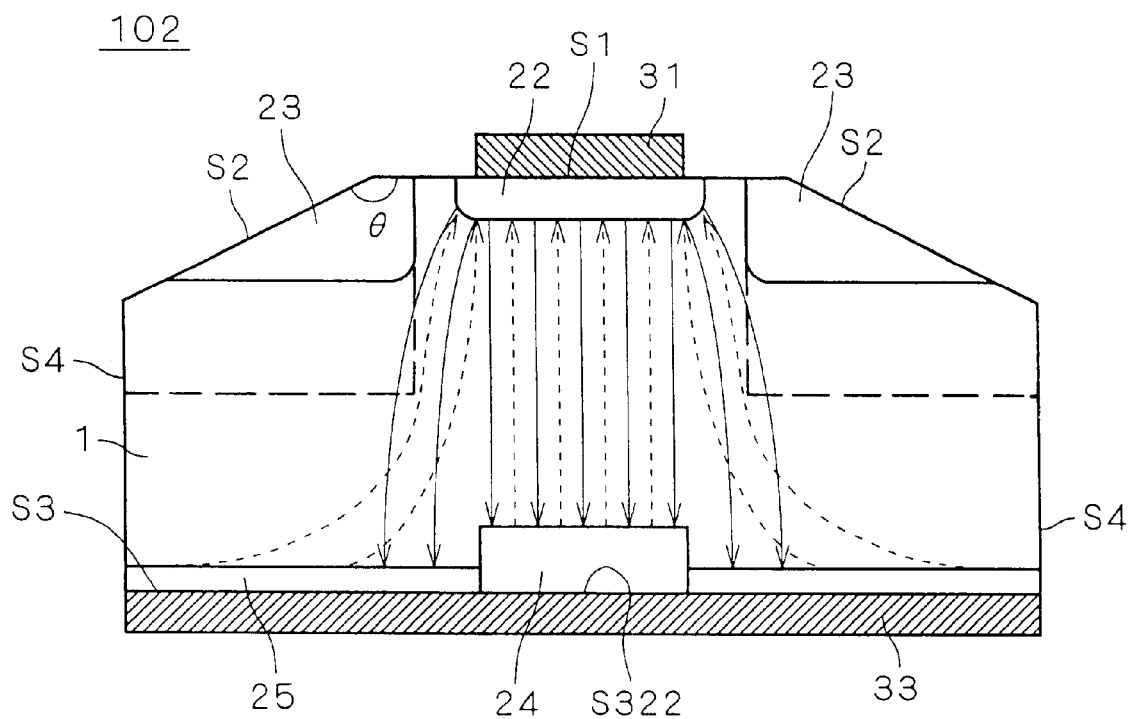
FIG. 4 is a vertical cross-sectional view for illustrating current flows in the semiconductor device according to the second preferred embodiment.

FIG. 4 is a vertical cross-sectional view for illustrating current flows in the semiconductor device 102. In FIG. 4, forward current is schematically shown by solid arrows and reverse current is schematically shown by dashed arrows.

The semiconductor device 102 produces effects to be described below in addition to the effects produced by the semiconductor device 101.

The semiconductor device 102 which comprises the $N^{++}$ and $N^+$ layers 24 and 25 having a higher electron concentration, i.e. a greater ability to supply electrons, than does the semiconductor substrate 1 can further reduce the reverse current as compared with the semiconductor device 101. This suppresses heat generation resulting from the reverse current.

In particular, the $N^{++}$ layer 24 formed in the part of the surface S3 which is substantially opposed to the P layer 22 allows the reverse current to converge on a portion lying between the $N^{++}$ layer 24 and the P layer 22, that is, on the center of the semiconductor substrate 1. This suppresses heat generation in the peripheral portion of the semiconductor substrate 1 during the reverse recovery operation.

Consequently, the semiconductor device 102 can suppress a trouble resulting from heat generated by the reverse current, to perform a stable operation.

Additionally, the $N^+$ layer 2 provides an ohmic contact between the semiconductor substrate 1 and the cathode electrode 33 to decrease an on-state voltage.

<Common Modifications to First and Second Preferred Embodiments>

Figure 5:
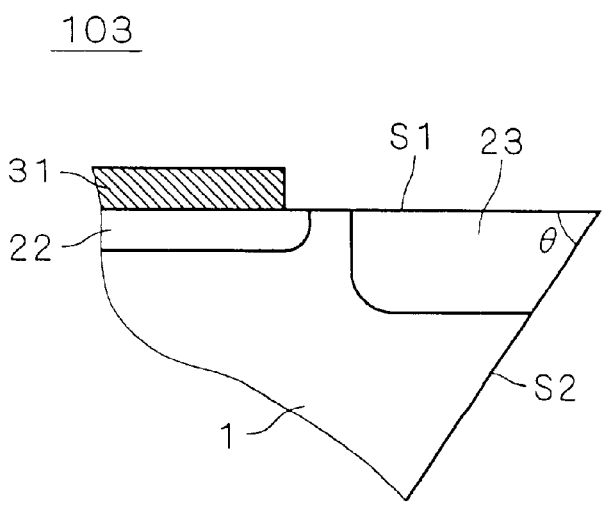
FIG. 5 is a vertical cross-sectional view for illustrating the semiconductor device according to a common modification to the first and second preferred embodiments.

The above description may apply to a semiconductor device 103 shown in vertical cross-section in FIG. 5 in which the angle θ is an acute angle.

Although the first and second conductivity types are the N and P types respectively in the above description, the conductivity types may be reversed.

While the invention has been described in detail, the foregoing description is in all aspects illustrative and not restrictive. It is understood that numerous other modifications and variations can be devised without departing from the scope of the invention.

What is claimed is:

1. A semiconductor device comprising:
   a first semiconductor layer of a first conductivity type having a first surface, a second surface surrounding said first surface and coupled to said first surface at an angle other than a right angle, and a third surface opposed to said first and second surfaces;
   a second semiconductor layer of a second conductivity type formed in said first surface; and
   a third semiconductor layer of said second conductivity type surrounding said second semiconductor layer in non-contacting relationship with said second semiconductor layer, said third semiconductor layer being formed in said first semiconductor layer and in contact with said second surface and a side surface coupled to said second surface,
   wherein a distance between said second semiconductor layer and said third semiconductor layer in their closely spaced positions is not greater than 50 μm.

2. The semiconductor device according to claim 1, wherein said third semiconductor layer extends closer to said third surface than does said second semiconductor layer.

3. The semiconductor device according to claim 1, further comprising
   a metal layer formed on the side of said third surface to cover a region of said third surface which is opposed to said second semiconductor layer.

4. The semiconductor device according to claim 1, further comprising
   a fourth semiconductor layer of said first conductivity type formed in part of said third surface which is substantially opposed to said second semiconductor layer,
   wherein said fourth semiconductor layer has an impurity concentration higher than the impurity concentration of its surrounding layer.

5. The semiconductor device according to claim 1, further comprising
   a fifth semiconductor layer of said first conductivity type formed in contact with said third surface, said fifth semiconductor layer having an impurity concentration higher than the impurity concentration of said first semiconductor layer.

* * * * *